PYROELECTRIC DETECTOR ASSEMBLY

Filed Dec. 21, 1967

INVENTOR.
HENRY P. BEERMAN
BY Joseph Levinson

United States Patent Office 3,539,803
Patented Nov. 10, 1970

3,539,803
PYROELECTRIC DETECTOR ASSEMBLY

Henry P. Beerman, Stamford, Conn., assignor to Barnes Engineering Company, Stamford, Conn., a corporation of Delaware Filed Dec. 21, 1967, Ser. No. 692,379
Int. Cl. H01l 1/02
U.S. Cl. 250—83 3 Claims

ABSTRACT OF THE DISCLOSURE

A field effect transistor and a resistor of high value are incorporated within the same evacuated housing as a pyroelectric detector in order to provide a detector assembly having a low output impedance, thereby allowing the detector assembly to be used with commercially available meters, amplifiers, and other utilization devices.

BACKGROUND OF THE INVENTION

Pyroelectric detectors are a class of thermal detectors whose operation depends on a pyroelectric effect. It utilizes a pyroelectric crystalline material which can be electrically polarized, and such materials exhibit temperature dependent charge effects. The pyroelectric detector is essentially a capacitor on which a charge, and consequently a voltage, appear when its temperature is changed. Among its advantages is that it requires no bias after initially being polarized. One of the disadvantages of the pyroelectric detector is its enormous output impedance, which is of the order of $10^{12}$ ohms. Accordingly, special amplifiers, meters, or utilization circuitry are required in utilizing the pyroelectric detector. Furthermore, problems are encountered in coupling the high output impedance detector to exterior circuitry. For example, moisture and dirt between the exterior leads of the detector package act like a short circuit to the enormously high output impedance of the pyroelectric detector element. It is an object of this invention to alleviate the aforesaid problems.

SUMMARY OF THE INVENTION

In carrying out this invention in one illustrative embodiment thereof, a pyroelectric detector assembly is provided which includes a field effect transistor and a resistor having a resistance on the order of the output resistance of the detector, as well as the detector mounted within the same evacuated housing.

DESCRIPTION OF THE PREFERRED EMBODIMENT

Figure 1:
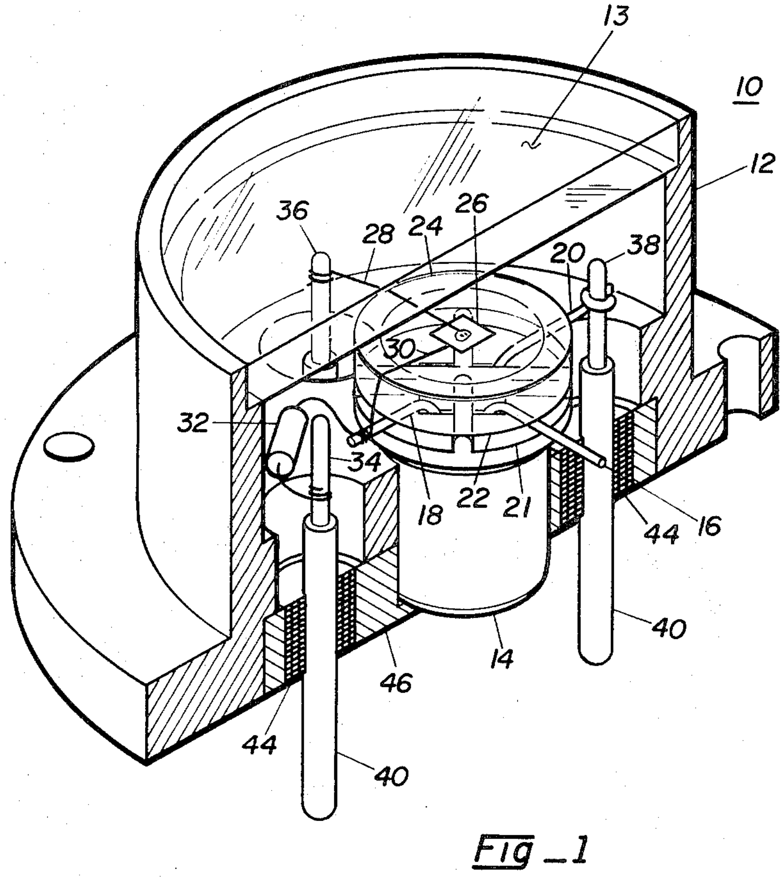
FIG. 1 is an isometric drawing, partly in section, of the pyroelectric detector assembly embodied in this invention.

Reference is now made to FIG. 1, which shows the pyroelectric detector assembly 10. The pyroelectric detector assembly 10 includes a housing 12 which is closed in one end thereof by a window 13. The window 13 is characterized by being transparent to the radiation which is desired to be measured. The base of the housing 12 is enclosed by a base plate 46 which has a central recess therein to accommodate the mounting of a field effect tranistor (FET) 14 therein. The FET 14 has a drain lead 16, a gate lead 18, and a source lead 20. Mounted on the base of the FET 14 is a transistor pad 21 through which the leads of the FET extend. A glass spacer ring 22 is mounted on the transistor pad 21, and a thin Mylar film disc 24 is mounted on the top of the ring 22 for supporting a pyroelectric detector 26. The pyroelectric detector 26 consists of a layer of pyroelectric crystalline material having conductive electrodes on opposite sides thereof. Although triglycene sulphate (TGS) is preferred, any suitable pyroelectric material exhibiting the pyroelectric effect may be utilized. The electrodes of the pyroelectric detector have external leads 28 and 30 connected thereto.

Figure 2:
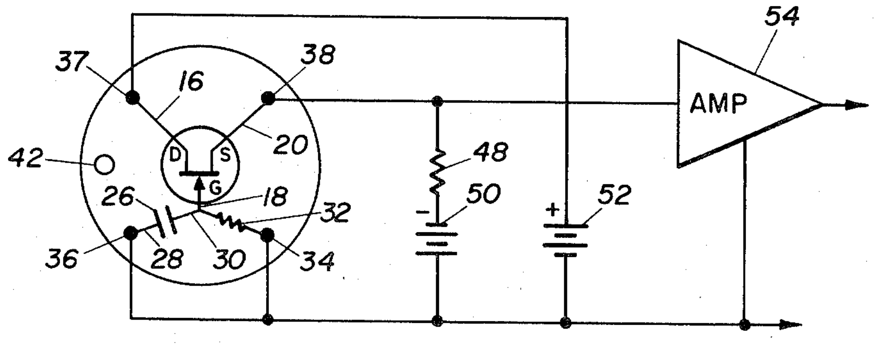
FIG. 2 is a schematic diagram of the pyroelectric detector coupled to an amplifier.

The FET 14 which is illustrated is a four-lead device, and therefore has four terminals, 34, 36, 38 and 37, the latter being shown in FIG. 2. The terminals are provided with suitable feedthroughs 40 which pass through an insulator 44 in the base plate 46. With respect to the FET, the TI SF5868A has been found suitable for the present application, although other field effect transistors may be utilized, whether three- or four-lead devices, without departing from the concepts of this invention. Also, although an N channel device is illustrated, a P channel device could be utilized by changing the polarity of the bias supply.

Also housed within the pyroelectric detector assembly 10 is an extremely high resistor 32, which is connected between the gate lead 18 and the terminal 34. This resistor has a magnitude on the order of $10^{11}$ to $10^{12}$ ohms. If a suitable resistor for this application cannot be obtained, resistors employing the surface resistance of glass can be used. In such a case, two Nichrome electrodes ¼″ wide by ⅛″ can be evaporated on an 0.04″ thick microscope glass slide section, leaving a gap of 0.005″ wide between the electrodes. This will provide the resistance of the magnitude desired.

Reference is now made to the schematic diagram of FIG. 2, which more clearly illustrates the interconnections in the assembly 10. The assembly 10 also includes exhaust tubulation 42 which makes evacuation of the assembly 10 possible. As shown on FIG. 2, the FET 14 is connected as a source follower. The FET is characterized by having a high input impedance and a low output impedance. The gate lead 18 is connected through resistor 32 to terminal 34. The pyroelectric detector 26, which is represented as a pure capacitance, is connected to the gate lead 18 by lead 30, and to the terminal 36 which is the ground terminal by lead 28. The source lead 20 is connected to terminal 38 and the drain lead 16 is connected to terminal 37. When connected to an external circuit as shown in FIG. 2, biasing means for the FET 14 are provided consisting of a resistor 48 and a source of potential 50 which are connected between the source terminal 38 and terminals 34 and 36, and a source of opposite polarity 52 is connected to terminal 37 and applied to the drain electrode of the FET 14. The output of the device, taken from the terminal 38, is applied to amplifier 54.

The FET 14 and the resistor 32 connected as shown in FIG. 2 represent the first stage of a high input impedance amplifier, and the actual output impedance of the detector assembly has been reduced to the order of 10K ohms. Therefore the amplifier 54 no longer requires a high input impedance. Thus the amplifier 54, or for that matter a meter or any other utilization circuitry of a conventional nature may be used, for example an amplifier such as the DP7 manufactured by Barnes Engineering Company, or other types of commercially available amplifiers or meters can be used in conjunction with a pyroelectric detector without the use of additional circuitry. The insertion of the extremely high resistance element 32 is required to insure stable operation. In the absence of such a high resistor, the FET 14 may drift into cut-off, and thus defeat its purpose.

Should the detector assembly 10 become depolarized due to an increase in temperature beyond the Curie point of the pyroelectric material, repolarization is easily accomplished with the detector assembly 10. This may be accomplished by connecting the drain and source leads 16 and 20 to the negative terminal of a 30 v. D.C. supply, with the positive terminal going to the external detector terminal 36. The application of this voltage for approximately two minutes is normally adequate.

The polyelectric detector assembly 10 thus provided allows the more versatile use of the pyroelectric detector with standard amplifiers and circuitry. The high impedance of the pyroelectric detector makes mating it to external circuits extremely difficult due to shortcircuiting which can occur in the coupling circuits due to humidity or accumulations of dirt on the external leads to the detector. Although in normal applications problems of humidity and dirt accumulation present extremely high impedance paths which would normally not shortcircuit devices, it does so in the present case with the pyroelectric detector because of its extremely high impedance. The present invention would thus eliminate heating elements and other means which would normally be employed to alleviate such problems.

I claim:

1. A pyroelectric detector assembly comprising (a) a housing having an opening on the upper side thereof covered by a window which is transparent to radiation which is to be measured and a cover plate closing the lower end thereof, (b) a plurality of terminal pins extending through said cover plate and insulated therefrom, (c) a field effect transistor mounted in said housing having gate, source and drain electrodes coupled to said terminal pins, (d) a pyroelectric detector mounted on a thin film of insulating material in said housing under said window for receiving radiation coming through said window, (e) means for coupling said pyroelectric detector between said gate electrode and one of said plurality of terminal pins, (f) an extremely high value resistor on the order of $10^{12}$ ohms coupled between said gate electrode and another of said plurality of terminal pins, and (g) said housing being evacuated.

2. The pyroelectric detector assembly set forth in claim 1 wherein said field effect transistor is positioned in a central recess in said cover plate with said pyroelectric detector being mounted on but thermally insulated from said field effects transistor.

3. The pyroelectric detector assembly set forth in claim 2 wherein said pyroelectric detector is mounted on a thin Mylar film which is in turn mounted on said field effect transistor and separated therefrom by a glass ring.

References Cited

UNITED STATES PATENTS

| | | | |
|---|---|---|---|
| 3,433,953 | 3/1969 | Sweet et al. | 250—83 |
| 3,453,887 | 7/1969 | Wooten | 317—235 X |
| 3,294,988 | 12/1966 | Packard | 307—308 X |
| 3,300,585 | 1/1967 | Reedyk et al. | |
| 3,351,786 | 11/1967 | Muller et al. | |
| 3,398,281 | 8/1968 | Treharne et al. | |

FOREIGN PATENTS

| | | |
|---|---|---|
| 147,815 | 9/1962 | U.S.S.R. |

ARCHIE R. BORCHELT, Primary Examiner

U.S. Cl. X.R.

73—359; 250—83.3; 317—234